US006639433B1

(12) United States Patent
Heckenbach

(10) Patent No.: US 6,639,433 B1
(45) Date of Patent: Oct. 28, 2003

(54) SELF-CONFIGURING OUTPUT CIRCUIT AND METHOD

(75) Inventor: Terry A. Heckenbach, Cedarburg, WI (US)

(73) Assignee: Johnson Controls Technology Company, Plymouth, MI (US)

( * ) Notice: Subject to any disclaimer, the term of this patent is extended or adjusted under 35 U.S.C. 154(b) by 0 days.

(21) Appl. No.: 10/124,989

(22) Filed: Apr. 18, 2002

(51) Int. Cl.$^7$ .................................................. H03K 3/00
(52) U.S. Cl. ........................................ 327/108; 327/436
(58) Field of Search .................... 327/108–112, 170, 327/434, 436, 437; 326/82, 83

(56) References Cited

U.S. PATENT DOCUMENTS

| | | | |
|---|---|---|---|
| 4,293,924 A | 10/1981 | Struger et al. ................. | 710/14 |
| 4,593,380 A | 6/1986 | Kocher et al. ................. | 710/31 |
| 4,628,397 A | 12/1986 | Gareis et al. .................. | 361/98 |
| 4,771,403 A | 9/1988 | Maskovyak et al. ........... | 710/14 |
| 4,951,250 A | 8/1990 | Cruickshank et al. ......... | 710/12 |
| 5,107,146 A | 4/1992 | El-Ayat ......................... | 326/41 |
| 5,134,311 A * | 7/1992 | Biber et al. ................... | 327/108 |
| 5,196,740 A | 3/1993 | Austin .......................... | 327/566 |
| 5,274,767 A | 12/1993 | Maskovyak .................... | 710/16 |
| 5,274,781 A | 12/1993 | Gibart .......................... | 710/16 |
| 5,325,518 A | 6/1994 | Bianchini, Jr. ................ | 714/31 |
| 5,327,425 A | 7/1994 | Niwa et al. ................... | 370/452 |
| 5,386,573 A | 1/1995 | Okamoto ...................... | 710/260 |
| 5,432,465 A | 7/1995 | Hsi-Jung et al. .............. | 326/38 |
| 5,440,695 A | 8/1995 | Janke et al. ................... | 700/12 |
| 5,537,653 A | 7/1996 | Bianchini, Jr. ................ | 714/25 |
| 5,555,438 A | 9/1996 | Blech et al. ................... | 710/30 |
| 5,563,526 A | 10/1996 | Hastings et al. ............... | 326/37 |
| 5,586,251 A | 12/1996 | Coleman et al. .............. | 714/43 |
| 5,677,639 A * | 10/1997 | Masiewicz ..................... | 326/82 |
| 5,701,515 A | 12/1997 | Gradeler ....................... | 710/14 |
| 5,798,658 A | 8/1998 | Werking ....................... | 326/83 |
| 5,838,177 A | 11/1998 | Keeth .......................... | 327/108 |
| 5,970,069 A | 10/1999 | Kumar et al. ................. | 370/402 |
| 5,999,610 A | 12/1999 | Lin et al. ..................... | 379/201 |
| 6,130,541 A * | 10/2000 | Ozguc .......................... | 324/678 |
| 6,166,593 A | 12/2000 | Ganzelmi et al. ............. | 327/564 |
| 6,308,231 B1 | 10/2001 | Galecki et al. ................ | 710/72 |

OTHER PUBLICATIONS

GE Fanus Automation "Genius® Distributed I/O System", Sep. 24, 1998.

* cited by examiner

*Primary Examiner*—Kenneth B. Wells
(74) *Attorney, Agent, or Firm*—Foley & Lardner

(57) ABSTRACT

A configurable analog output circuit comprises a current output circuit, a voltage output circuit, and a switch circuit. The current output circuit is capable of producing a current output signal usable to control a current through an output device. The voltage output circuit is capable of producing a voltage output signal usable to control a voltage across the output device. The switch circuit is capable of switching the analog output circuit between a first mode of operation in which the current output circuit is active and a second mode of operation in which the voltage output circuit is active. The switch circuit switches the analog output circuit between the first and second modes of operation responsive to a detected characteristic of the output device.

15 Claims, 5 Drawing Sheets

SELF-CONFIGURING OUTPUT CIRCUIT AND METHOD

BACKGROUND OF THE INVENTION

1. Field of the Invention

The invention relates to output circuits that provide output signals usable to control output devices.

2. Description of the Related Art

Output circuits are used for controlling output devices. In industrial applications, for example, output circuits are used to control devices such as fans, actuators, temperature control systems, lighting systems, and so on. One type of output circuit is an analog voltage output circuit. Typically, analog voltage output circuits provide an output voltage having a magnitude which is indicative of a desired output state of an output device. For example, in some applications, industry standards have been developed which specify that such voltage output circuits provide an output voltage in the range of 0 to 10 volts, with the output voltage having a magnitude that is proportional to a desired output condition. Thus, for a variable speed motor, an output circuit may provide an output voltage having a magnitude of 5 volts to cause the motor to operate at 50% maximum speed. An output device that is controlled in this manner is often referred to as a voltage-controlled output device.

Another type of output circuit is an analog current output circuit. Typically, analog current output circuits provide an output current having a magnitude which is indicative of a desired output state of an output device. For example, in some applications, industry standards have been developed which specify that such output circuits produce an output current in the range of 4 to 20 milliamps, with the output voltage or output current having a magnitude that is proportional to a desired output condition. For example, for a lighting system, an output circuit may provide an output current having a magnitude of 16 milliamps to cause the lighting system to operate at 75% maximum brightness. An output device that is controlled in this manner is often referred to as a current-controlled output device.

In general, an output device is either a voltage controlled output device or a current controlled output device, but not both. Generally, it is necessary that the output circuit be matched with the type of output device used, that is, that analog voltage output circuits be used with voltage-controlled output devices and analog current output circuits be used with current-controlled output devices.

When installing a new control system or modifying an existing control system, it is not always known which type of output devices will be or have been used. For example, when modifying an existing control system, where a new controller is installed but the output devices of the original system remain in place, it is generally not known in advance whether particular output devices are current controlled output devices or a-voltage controlled output devices. While this information can be determined by examining product specifications for the output device and/or by performing suitable measurements, this process is time consuming and not always possible or practical to perform.

SUMMARY OF THE INVENTION

According to a first aspect, a configurable analog output circuit comprises a current output circuit, a voltage output circuit, and a switch circuit. The current output circuit is capable of producing a current output signal usable to control a current through an output device. The voltage output circuit is capable of producing a voltage output signal usable to control a voltage across the output device. The switch circuit is capable of switching the analog output circuit between a first mode of operation in which the current output circuit is active and a second mode of operation in which the voltage output circuit is active. The switch circuit switches the analog output circuit between the first and second modes of operation responsive to a detected characteristic of the output device.

According to another aspect, a configurable analog output circuit comprises an output stage and a detection circuit. The output stage has first and second modes of operation. In the first mode of operation, the output stage provides an output device with an output current in the first mode of operation. In the second mode of operation, the output stage provides the output device with an output voltage. The detection circuit is coupled to the output stage. The detection circuit detects a characteristic of the output device and, in response, places the output stage in the first or second mode of operation.

According to another preferred aspect, a method of configuring an output circuit comprises simultaneously attempting to provide an output current and an output voltage to an output device. This step is performed by the output circuit in accordance with an input signal received by the output circuit. The method further comprises detecting (1) that providing the output device with the output current causes a voltage-providing capacity of the output circuit to be exceeded, or detecting (2) that providing the output device with the output voltage causes a current-providing capacity of the output circuit to be exceeded. In response to the detecting step (1), the output circuit is placed in a voltage output mode of operation in which the output circuit varies the output voltage in accordance with the input signal and provides the output voltage to the output device. In response to the detecting step (2), the output circuit is placed in a current output mode of operation in which the output circuit varies the output current in accordance with the input signal and provides the output current to the output device.

DETAILED DESCRIPTION OF THE PREFERRED EMBODIMENTS

Figure 1:
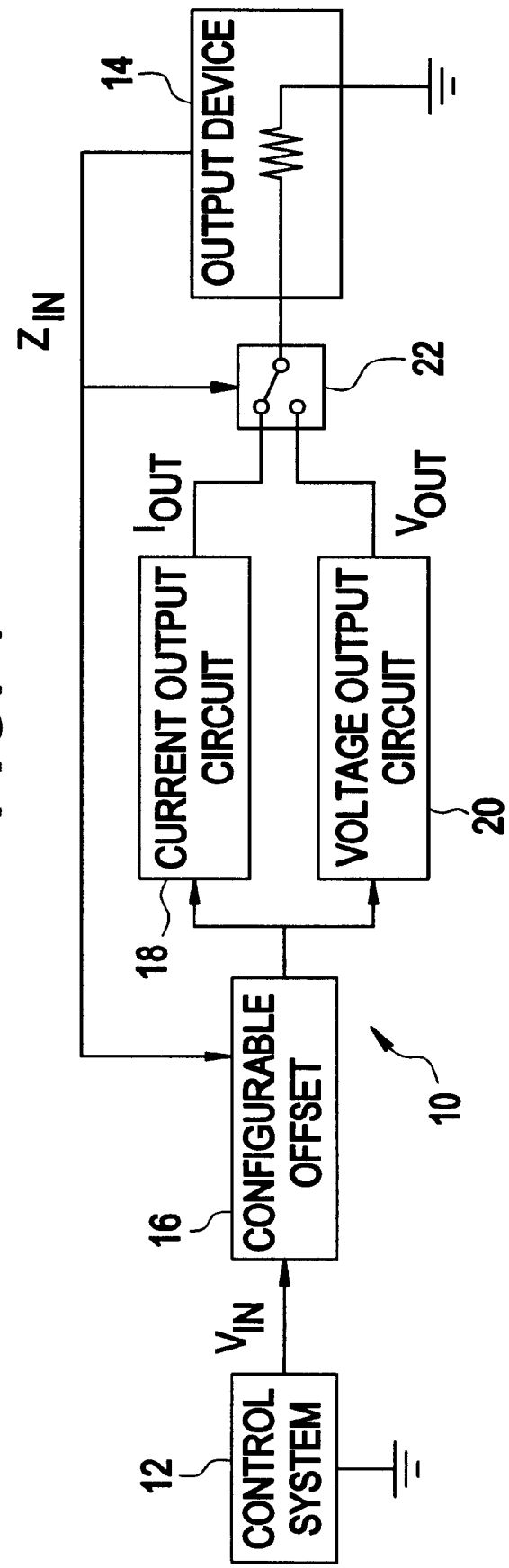
FIG. 1 is a control system that includes a self configuring output circuit according to a preferred embodiment.

Referring now to FIG. 1, an overview of a control system that includes an output circuit 10 according to one embodiment is illustrated. The control system further includes a controller 12 and an output device 14. The output circuit 10 further includes a configurable offset circuit 16, a current output circuit 18, a voltage output circuit 20, and a switch circuit 22. The output control circuit 10 may be used in a variety of different types of applications. For purposes of explanation, it is assumed herein that the control circuit 10 is used in an industrial control application.

The controller 12 produces an analog control signal for the control circuit 10. The controller 12 may, for example, be a microprocessor-based controller. In this case, the control signal may be the output of a D/A converter (not shown) ranging, for example, between 0–5 volts, depending on a desired output state of the output device 14. As another example, the controller 12 may simply be the output of a potentiometer connected between a voltage source and ground and controlled by a human operator. The control signal may also be a current signal instead of a voltage signal. Other arrangements may also be used.

The control signal from the controller 12 is received as an input signal to the output circuit 10. The output circuit 10 processes the output signal and provides the processed output signal to the output device 14 The output device 14 may be a lighting system, a mechanical actuator, a fan, a temperature control system, or any other type of output device. The output device 14 may be a microprocessor-based system that accepts the output signal as input, digitizes the input signal, and uses the input signal for microprocessor-based control of the output device 14 As another example, the output device 14 may simply be an electromechanical actuator that has a state which is directly controlled by the signal from the output circuit 10.

The output circuit 10 has first and second modes of operation, specifically, in the illustrated embodiment, an analog current mode of operation and an analog voltage mode of operation. In the analog current mode of operation, the current output circuit 18 operates in combination with an output stage which implements the switch circuit 22 to drive an output device with an output current. In the analog voltage mode of operation, the voltage output circuit 20 operates in combination with the output stage to drive an output device with an output voltage. Typically, one or the other of the two modes of operation is used with a given output device. It may be noted that the output circuit 10 may have more than two modes of operation. For example, if it is desired for the output circuit 10 to be able to produce additional outputs (e.g., a 0–5 volt output in addition to the 0–10 volt and 4–20 mA outputs described herein), additional modes of operation may also be employed.

As previously indicated, in some applications, industry standards have been developed which specify that output devices are controlled with currents in the range of 4 to 20 milliamps or with voltages in the range of 0 to 10 volts. Assuming the output circuit 10 produces an output signal that conforms to these standards, the current output circuit 18 produces a current output signal which varies in accordance with an equation having a form $I_{OUT}=m_1V_{IN}+b_1$, where $I_{OUT}$ is a magnitude of the current through the output device, $V_{IN}$ is a magnitude of the input signal, $b_1$ is a magnitude of a first offset applied to the input signal, and $m_1$ is a first scale factor applied to the input signal. The output current is thus proportionally related to the voltage input signal. Assuming the output circuit 10 is constructed such that $b_1$ is approximately equal to 4 mA and ml is approximately equal to 3.2 mA/V, then a 0–5 V input signal $V_{IN}$ causes the current output signal $I_{OUT}$ to vary in a range of approximately 4–20 mA. In the embodiments of FIGS. 2–5 discussed below, $m_1$ and $b_1$ are each determined by resistor values in both the configurable offset circuit 16 and the current output circuit 18. In general, actual values for $b_1$ and ml are likely to deviate somewhat from the above values based on component selection and related design issues.

In the voltage mode of operation, the output circuit 10 produces a voltage output signal which controls the voltage across the output device so as to vary in accordance with an equation having a form $V_{OUT}=m_2V_{IN}+b_2$, where $V_{OUT}$ is a magnitude of the voltage across the output device, $V_{IN}$ is a magnitude of the input signal, $b_2$ is a magnitude of a second offset applied to the input signal, and $m_2$ is a second scale factor applied to the input signal. The output voltage is proportionally related to the input signal. Assuming the output circuit 10 is constructed such that $b_2$ is approximately equal to zero and ml is approximately equal to 2, then a 0–5 V input signal $V_{IN}$ causes the current output signal $I_{OUT}$ to vary in a range of approximately 0–10 mA. As detailed below, in the preferred embodiment, these conditions is met by introducing a small offset (e.g., $b_2$ approximately equal to 0.05) to stabilize circuit operation under zero input voltage conditions. In the embodiments of FIGS. 2–5 discussed below, $m_2$ and $b_2$ are each determined by resistor values in both the configurable offset circuit 16 and the voltage output circuit 20. Additionally, in general, actual values for $b_2$ and $m_2$ are likely to deviate somewhat from the above values based on component selection and related design issues.

In operation, the input signal is received by the configurable offset circuit 16. The offset circuit 16 is configurable between the first and second modes of operation, such that the output circuit 10 applies a first offset to the input signal in the analog current mode of operation and a second offset to the input signal in the analog voltage mode of operation. In practice, the size of the offset adjustment applied by the configurable offset circuit 16 is a function of the magnitude of the input voltage, such that in both modes the size of the offset adjustment decreases as the input voltage approaches five volts. For example, the configurable offset circuit 16 may apply an offset adjustment such that a 0–5 V input signal yields approximately a 1–5 V signal at the input of the current output circuit 18 in the analog current mode of operation, and may apply an offset adjustment such that a 0–5 V input signal yields approximately a 0.05–5 V signal at the input of the voltage output circuit 20 in the analog voltage mode of operation.

As detailed below, the configurable offset circuit 16 switches between applying the first offset and the second offset responsive to a detected characteristic of the output device 14, such as impedance. To this end, the offset circuit 16 receives a control signal that varies depending on the detected characteristic of the output device. Although this control signal is shown as coming from the output device 14, this is intended to represent that the configurable offset circuit 16 switches modes based on a detected characteristic of the output device 14 In practice, the signal that controls the state of the configurable offset circuit 16 actually originates within the output circuit 10, as described in greater detail below. The output of the configurable offset circuit 16 flows to both the current output circuit 18 and the voltage output circuit 20.

The current output circuit 18 scales the 1–5 V signal from the configurable offset circuit 16 to produce a signal usable to yield a 4–20 mA output current or, depending on which circuit is active, the voltage output circuit 20 scales the 0.05–5 V signal from the offset circuit 16 to produce a signal usable to yield a 0.1–10 V output voltage. The switch circuit 22 comprises an output stage which cooperates with the circuits 18 and 20 to produce the output current/voltage and to switch between the two modes of operation. The switch circuit 22 is controlled by the same circuit that controls the configurable offset circuit 16, and thus is controlled responsive to a detected characteristic (such as impedance) of the output device 14 The output of the switch circuit 22 is then provided to the output device 14

Figure 2:
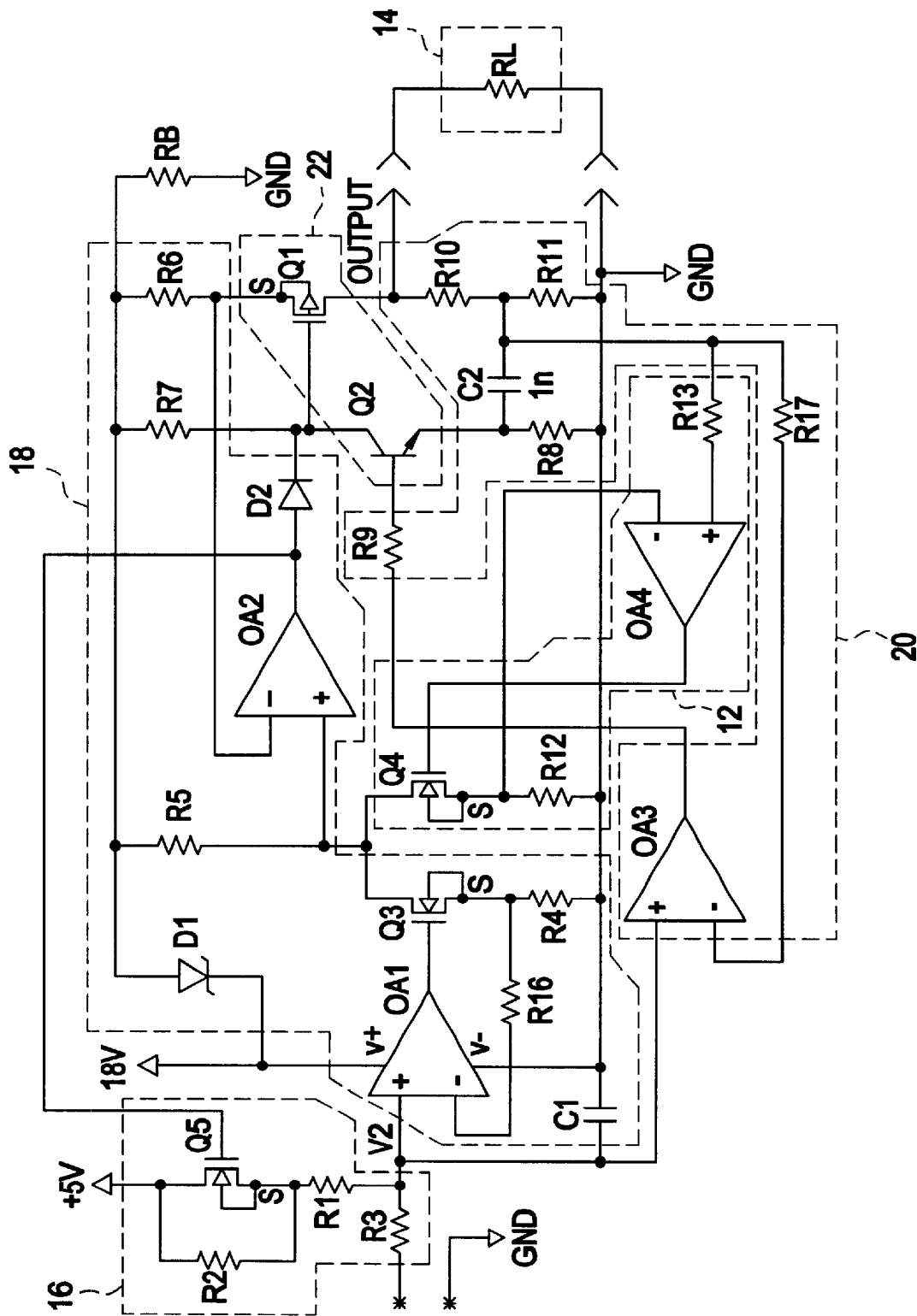
FIG. 2 is a self configuring output circuit according to a preferred embodiment.
Figure 3:
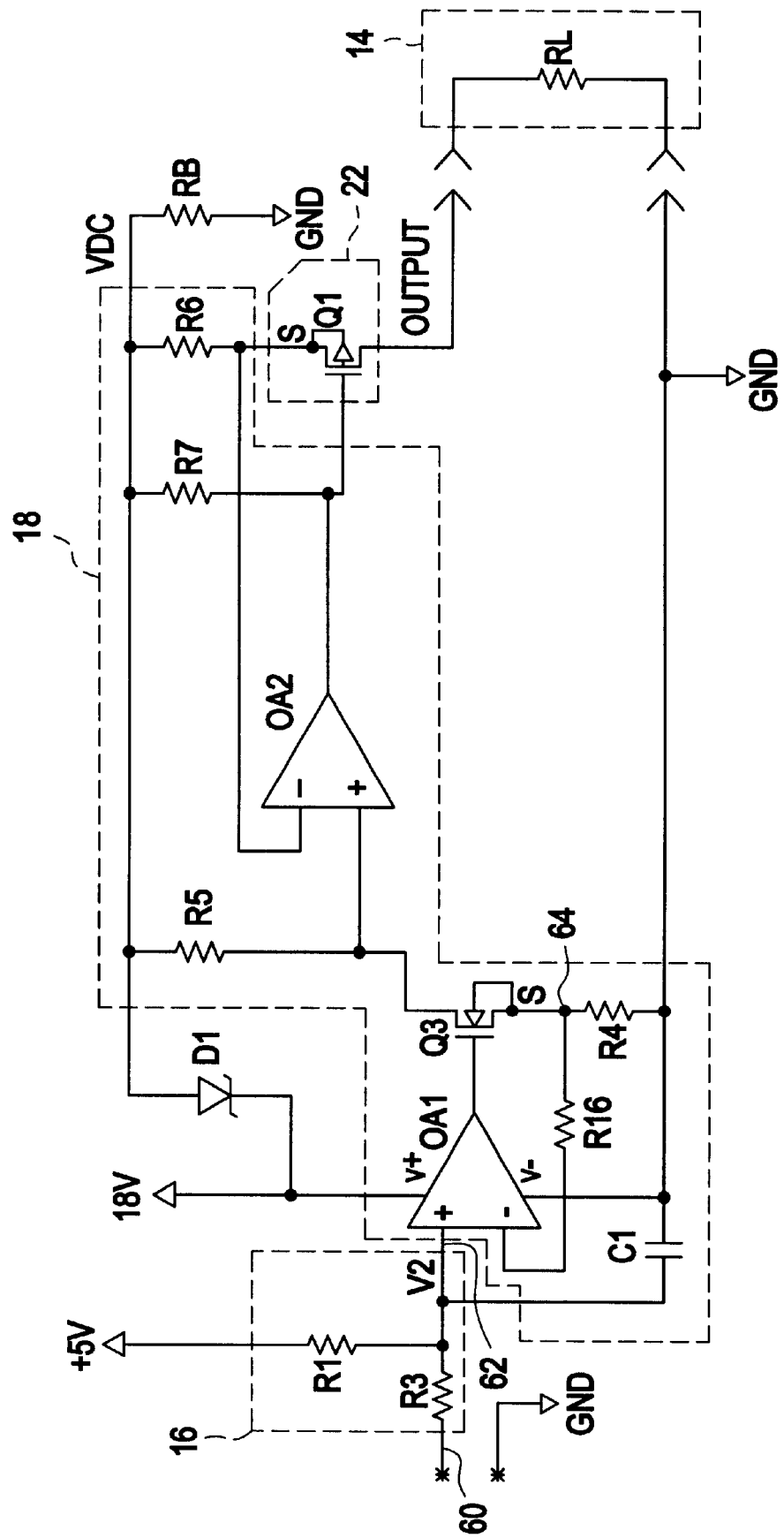
FIG. 3 is a portion of the circuit of FIG. 1 which implements an analog current output circuit.
Figure 4:
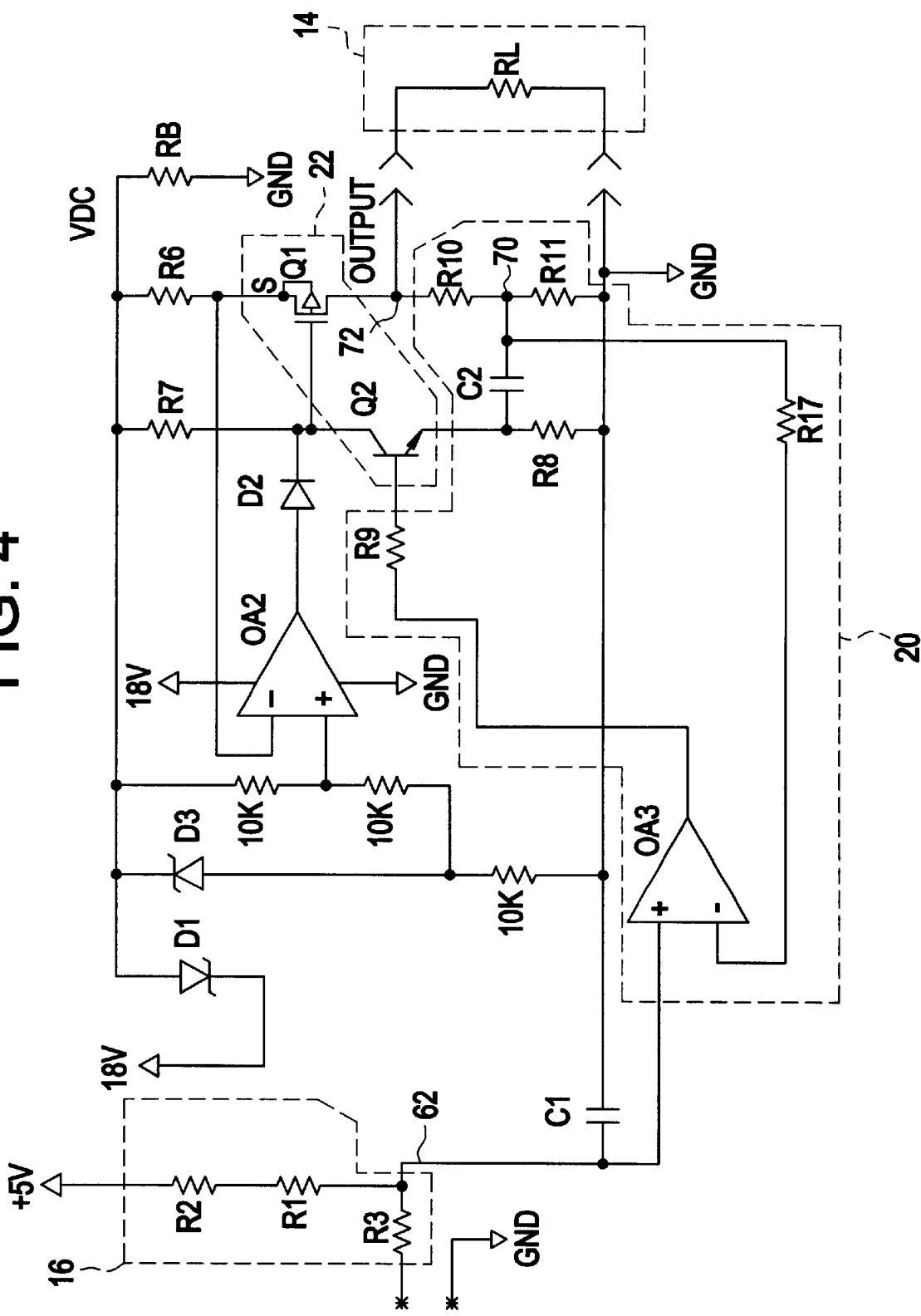
FIG. 4 is a portion of the circuit of FIG. 1 which implements an analog voltage output circuit.

Referring now to FIGS. 2–4, one possible implementation of the output circuit 10 is shown. FIG. 2 shows the complete output circuit 10. FIG. 3 is a simplified illustration of the output circuit 10 in which the output circuit 10 is in the analog current mode of operation, and the components not associated with the analog current mode of operation have been removed. FIG. 4 is a simplified illustration of the output circuit 10 in which the output circuit 10 is in the analog voltage mode of operation with current limit, and the components not associated with the analog voltage mode of operation have been removed.

Referring first to FIG. 2, FIG. 2 shows an exemplary embodiment of the output circuit 10 of FIG. 1. Table I below provides exemplary component values for the circuit of FIG. 2. The circuit of FIG. 2 is also discussed in greater detail below after the discussion of FIGS. 3–4.

TABLE I

Exemplary component values for circuit of FIG. 2

| COMPONENT | VALUE |
|---|---|
| C1 | 100 n |
| C2 | 1 n |
| D1 | 2.7 V |
| D2 | 1N4004 |
| OA1 | LM324 |
| OA2 | LM324 |
| OA3 | LM324 |
| OA4 | LM324 |
| Q1 | 1RF9210 |
| Q2 | 2N3904 |
| Q3 | 2N7002 |
| Q4 | 2N7002 |
| Q5 | 2N7002 |
| R1 | 40K |
| R2 | 1 Meg |
| R3 | 10K |
| R4 | 2490 |
| R5 | 1000 |
| R6 | 100 |
| R7 | 4990 |
| R8 | 3000 |
| R9 | 50K |
| R10 | 2490 |
| R11 | 2490 |
| R12 | 24.9K |
| R13 | 24.9K |
| R16 | 20K |
| R17 | 20K |
| RB | 4990 |

Referring now to FIG. 3, the analog current mode of operation will be described. FIG. 3 is a simplified version of the circuit of FIG. 2 in which circuit components that are not used in the analog current mode of operation have been removed.

In operation, the input voltage signal is received at node 60. Due to the voltage divider circuit established by the resistors R1 and R3 (resistor R2 in FIG. 2 is short circuited by the transistor Q5), the voltage at node 62 ranges from 1–5 V depending on the magnitude of the input voltage signal, which ranges from 0–5 V. The operational amplifier ("op-amp") OA1 is connected to a gate input of transistor Q3, and in combination the op-amp OA1 and the transistor Q3 operate as a voltage-controlled current sink. The op-amp OA1 controls the transistor Q3 such that the voltage at node 64 is equal to the voltage at node 62. Given the magnitude of resistor R4, the current flowing through the resistor R4 ranges between approximately 0.4 mA to 2.0 mA (2490Ω× 0.4 mA≈1.0 V; 2490Ω×2 mA≈5.0 V). The current that flows through the resistor R4 also flows through resistor R5. The operational amplifier OA2 controls a gate input of transistor Q1 such that the voltage drop across resistor R6 is equal to the voltage drop across the resistor R5. The current that flows through the resistor R6 is the current that flows through the output device 14, shown as having an impedance RL. Because the resistor R6 is one tenth the size of the resistor R5, the current flowing through the resistor R6 is ten times the amount of current flowing through the resistor R5, or 4.0 mA to 20 mA, depending on the magnitude of the input voltage signal. The remaining components are biasing components, except for diode D1 which introduces a voltage drop that allows lower cost amplifiers to be used.

Referring now to FIG. 4, the analog voltage mode of operation will now be described. FIG. 4 is a simplified version of the circuit of FIG. 2 in which circuit components that are not used in the analog voltage mode of operation have been removed.

In operation, the input signal is received at node 60. Resistors R1–R3 implement a voltage divider circuit which cause the voltage at node 62 to vary between 0.05 and 5.0 volts, depending on the magnitude of the input signal. The slight positive voltage, 0.05 volts, is useful in allowing lower cost amplifiers to be used and does not introduce significant error into the output signal (approximately 1% error or less, which is acceptable in most applications). Op-amp OA3 operates to maintain the voltage at node 70 equal to the voltage at node 62. An impedance circuit formed by resistors R10–R11 operates as a voltage-divider circuit, such that the voltage at node 72 is approximately twice the voltage at node 62. Thus, because the voltage at node 62 varies between 0.05 volts and 5.0 volts, the voltage at node 72 varies between 0.10 volts and 10.0 volts.

The op-amp OA2 performs a current limiting function in the analog voltage mode of operation. Specifically, the op-amp OA2 overrides the voltage control circuit at the gate of transistor Q1 to limit the output current in the analog voltage mode of operation. The resistor R6 is used for current detection. For simplicity, in the circuit of FIG. 4, the current limit is fixed by the series of resistors connected to the positive input terminal of the op-amp OA2. It may be noted that in the circuit of FIG. 2, the current limit is a variable current limit and is proportional to the magnitude of the input voltage. The transistor Q1 is an inverting transistor and becomes less conductive as its gate voltage increases with respect to GND. Capacitor C2 provides frequency stability.

Referring again to FIG. 2, additional details regarding the combined operation of the circuits 18 and 20 will now be provided. First, operation of the output circuit 10 to place itself in the analog current or analog voltage mode of operation is described. By way of overview, the output circuit 10 simultaneously attempts to provide an output current and an output voltage to the output device 14 in accordance with the input signal received by the output circuit 10. If the impedance of the output device 14 is less than 500 ohms, then the output device is assumed to be a current-controlled output device. In this case, the output circuit 10 simultaneously attempts to provide an output current and an output voltage to the output device 14 in accordance with the equations $I_{OUT}=m_1V_{IN}+b_1$ and $V_{OUT}=m_2V_{IN}+b_2$, respectively. However, providing the output device 14 with the output voltage causes a current-providing capacity of the output circuit 10 to be exceeded. This is detected by the resistor R6 and the op-amp OA2 which form a current detection circuit. In response, the output of the op-amp OA2 causes the voltage at the gate of the transistor Q1 to increase, thereby limiting current through the transistor Q1. The current limit is not fixed, however, and varies in accordance with the voltage across the resistor R5 which in turn is determined by the input signal to the output circuit 10. At the same time, the output of op-amp OA2 also causes transistor Q5 to close, thereby shorting resistor R2 and changing the offset applied to the input signal. The output circuit 10 thus places itself in a current output mode of operation in which the output circuit 10 varies the output current in accordance with the input signal and provides the output current to the output device 14

Alternatively, if the impedance of the output device 14 is greater than 500 ohms, then the output device is assumed to be a voltage-controlled output device. In this case, providing the output device 14 with the output current causes a voltage-providing capacity of the output circuit 10 (particularly, op-amp OA3) to be exceeded. This is detected by the op-amp OA2 by virtue of the current limit not being exceeded. In response, the output circuit 10 places itself in a voltage output mode of operation in which the output circuit 10 varies the output voltage in accordance with the input signal and provides the output voltage to the output device 14 Transistor Q5 is off. Thus, based on whichever demand is lower (voltage or current), the output circuit 10 operates in a particular mode (voltage controlled mode or current controlled mode). This process happens continuously.

The following is a further numeric example which provides further explanation the operation of the output circuit 10. Assume that the voltage at node 60 equals the voltage at node 62 by ignoring the effects of resistor R2. Further, assume that the input voltage $V_{IN}$ is 3 Volts and a load resistance RL of 1000 ohms is attached to the output circuit 10. Op-amp OA3 adjusts its output by driving transistor Q2 which drives transistor Q1 to maintain 6 Volts at node 72, the output of the output circuit 10. With 6 Volts at the output and 1000 ohms attached, the current flowing through the load resistance RL is 6 mA. Op-amp OA1 adjusts its output to maintain 1.2 mA flowing through the resistors R4 and R5 and the transistor Q3. Op-amp OA2 adjusts its output to attempt to maintain 12 mA flowing through transistor Q1. Because the voltage control has set 6 mA flowing through transistor Q1, the output of op-amp OA2 is driven as low as it can go, nearly 0 Volts, since diode D2 prevents the output of op-amp OA2 from controlling the transistor Q1. Also transistor Q5 is kept non-conducting. In this manner, the output circuit 10 thus places itself in the voltage output mode of operation. If the output circuit 10 is then shorted across the load resistance RL, op-amp OA2 will limit the output current.

Now assume that the input voltage $V_{IN}$ is 3 Volts and a load resistance RL of 100 ohms is attached to the output circuit 10. Op-amp OA3 adjusts its output by driving transistor Q2 which drives transistor Q1 to maintain 6 Volts at the circuit output. With 6 Volts at the output and 100 ohms attached, the current flowing through the load resistance RL is 60 mA. However, op-amp OA1 adjusts its output to maintain 1.2 mA flowing through the resistors R4 and R5 and the transistor Q3. Op-amp OA2 adjusts its output to attempt to maintain 12 mA flowing through transistor Q1. Because the voltage control has set 60 mA flowing through transistor Q1, the output of op-amp OA2 is driven high to limit the output current to 12 mA and diode D2 is now conductive and the gate of transistor Q1 is controlled by op-amp OA2 and transistor Q5 is conductive which increases the control voltage from 3 Volts to 3.4 Volts. This higher voltage does not change the operation of op-amp OA3 since it is already at maximum. However, op-amp OA1 adjusts its output to maintain 1.36 mA flowing through transistor Q3 and resistor R5. Op-amp OA2 adjusts its output to attempt to maintain 13.6 mA flowing through resistor R6 and transistor Q1. Op-amp OA4 and transistor Q4 form a compensation circuit used to compensate for the current diverted from RL by the resistor divider formed of resistors R10 and R11. In this manner, the output circuit 10 places itself in the current output mode of operation.

The circuit thus provides 4 to 20 mA through the output whenever the externally attached resistive load resistance RL varies from 0 to 500 ohms. The circuit provides 0.10 to 10 Volts across the output whenever the externally attached resistive load resistance, RL varies from 500 ohms and greater. In some typical industrial control applications, voltage controlled output devices typically have an impedance of 1000 ohms or greater, and current controlled output devices typically have an impedance of 300 ohms or less and typically are in the range of 100–250 ohms.

Figure 5:
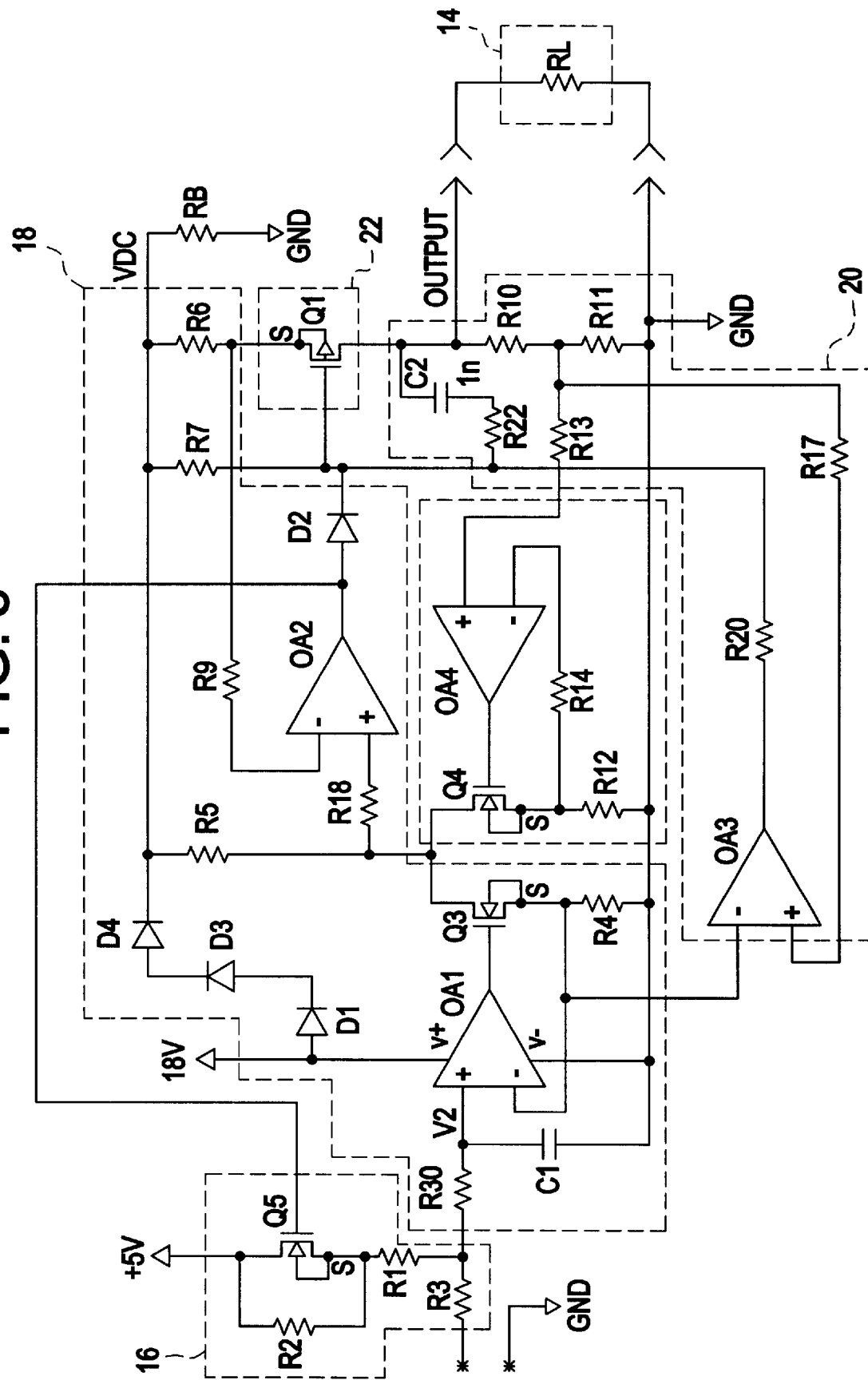
FIG. 5 is a self configuring output circuit according to another preferred embodiment.

Referring now to FIG. 5, a self configuring output circuit according to another preferred embodiment is shown. The following Table provides exemplary component values for the circuit of FIG. 5.

TABLE II

Exemplary component values for circuit of FIG. 5

| COMPONENT | VALUE |
| --- | --- |
| C1 | 100 n |
| C2 | 1 n |
| D1 | 1N4004 |
| D2 | 1N4004 |
| D3 | 1N4004 |
| D4 | 1N4004 |
| OA1 | LM324 |
| OA2 | LM324 |
| OA3 | LM324 |
| OA4 | LM324 |
| Q1 | 1RF9210 |
| Q3 | 2N7002 |
| Q4 | 2N7002 |
| Q5 | 2N7002 |
| R1 | 20.0K |
| R2 | 499K |
| R3 | 4990 |
| R4 | 2490 |
| R5 | 2260 |
| R6 | 226 |
| R7 | 4990 |
| R9 | 7500 |
| R10 | 2490 |
| R11 | 2490 |
| R12 | 24.9K |
| R13 | 12.1K |
| R14 | 10.0K |
| R17 | 10.0K |
| R18 | 10.0K |
| R20 | 3010 |
| R22 | 1500 |
| R30 | 8.06K |
| RB | 4.99K |

The embodiment of FIG. 5 improves upon the embodiment of FIG. 2 in a number of respects. In the embodiment of FIG. 2, the op-amps OA1–OA4 operate best with low input errors (input offset voltage $V_{os}$, input bias current $I_b$, and input offset current $I_{os}$) to allow proper switchover between voltage control operation and current control operation. The output voltage is reduced by $2*(I_{os3}*R17+V_{os3})$, where $I_{os3}$ is considered positive when the current exits the negative op-amp input, and where $V_{os3}$ is considered with respect to the negative input of op-amp OA3. Likewise the output current will be increased or reduced by combination of multiples of $I_{os1}$, $I_{os2}$, $I_{b2}$, $I_{os4}$, $I_{b4}$, $V_{os1}$, $V_{os2}$, and $V_{os4}$. The current output circuit 18 ideally switches off when the load resistance RL exceeds 500 ohms. At the same time V2, which also commands the voltage output circuit 20, decreases because transistor Q5 is switched off by op-amp OA2.

In the embodiment of FIG. 2, op-amp errors result in the two control circuits conflicting when the load resistance RL is near 500 ohms. The range of load resistance RL over which the switchover occurs will depend upon the value of the input voltage $V_{IN}$ and the magnitudes of the errors. Using the common LM324 op-amp in the circuit of FIG. 2, for example, with the input voltage $V_{IN}$=0 volts, switchover may be spread over a range of RL from about 300 ohms to 600 ohms and within part of this range neither the voltage output nor the current output will be correct because transistor Q5 is only partially conducting. The op-amp errors are mainly the result of silicon wafer processing variations. The largest variation occurs from lot to lot but can also vary within lots. However, the differences between the input errors of the op-amps within a single integrated circuit are very small and the errors will track each other.

In the embodiment of FIG. 5, the voltage output circuit 20 is modified such that the feedback point from the circuit output has been moved from the negative input to the positive input of op-amp OA3, the negative input of op-amp OA3 has been moved from the positive input of op-amp OA1 to the negative input of op-amp OA1, and transistor Q2 has been eliminated. In this configuration, the voltage $V_{os3}$ subtracts from the voltage $V_{os1}$, which eliminates the first order effects of voltage input offset errors from the circuit voltage output. Proper selection of the values of all the resistors (see Table II) in the current control circuit likewise produces cancellation of the first order effects of currents $I_{os}$ and $I_b$ as well as minimizing the sensitivity to differences between the resistors. Diode D1 has been replaced with diodes D1, D3, and D4 to increase the supply voltage VDC by about 0.5 Volts, allowing increased voltage drop across resistor R6. In the embodiment of FIG. 5, the load resistance RL at which the switchover between voltage control operation and current control operation occurs is always very close to 500 ohms.

While the embodiments illustrated in the Figures and described above are presently preferred, it should be understood that these embodiments are offered by way of example only. The invention is not limited to a particular embodiment, but extends to various modifications, combinations, and permutations that nevertheless fall within the scope and spirit of the appended claims.

What is claimed is:

1. A configurable analog output circuit comprising:
   a current output circuit, the current output circuit being capable of producing a current output signal usable to control a current through an output device;
   a voltage output circuit, the voltage output circuit being capable of producing a voltage output signal usable to control a voltage across the output device;
   a switch circuit, the switch circuit being capable of switching the analog output circuit between a first mode of operation in which the current output circuit is active and a second mode of operation in which the voltage output circuit is active, the switch circuit switching the analog output circuit between the first and second modes of operation responsive to a detected characteristic of the output device.

2. An output circuit according to claim 1, wherein the detected characteristic is an impedance of the output device.

3. An output circuit according to claim 2,
   wherein the switch circuit is an output stage of the analog output circuit;
   wherein the impedance is measured by at least one of the current and voltage output circuits; and
   wherein the output stage receives a signal from the at least one of the current and voltage output circuits that causes the output stage to switch the analog output circuit between the first and second modes of operation.

4. An output circuit according to claim 2,
   wherein the analog output circuit receives an input signal;
   wherein the analog output circuit comprises a configurable offset circuit, the configurable offset circuit being capable of applying a first offset to the input signal in the first mode of operation and a second offset to the input signal in the second mode of operation, the second offset being different than the first offset; and
   wherein the configurable offset circuit switches between applying the first offset and the second offset responsive to the impedance of the output device.

5. An output circuit according to claim 2,
   wherein, in the first mode of operation, the current output signal controls the current through the output device so as to vary in a range of approximately four to twenty milliamps depending on an input signal to the analog output circuit; and
   wherein, in the second mode of operation, the voltage output signal controls the voltage across the output device so as to vary in a range of approximately zero to ten volts depending on an input signal to the analog output circuit.

6. A configurable analog output circuit comprising:
   an output stage, the output stage having first and second modes of operation, the output stage providing an output device with an output current in the first mode of operation and providing the output device with an output voltage in the second mode of operation; and
   a detection circuit, the detection circuit being coupled to the output stage, and the detection circuit detecting a characteristic of the output device and, in response, placing the output stage in the first or second mode of operation,
   wherein the detection circuit comprises a first converter circuit, the first converter circuit being coupled to an input of the output stage, the first converter circuit having an active state in which the first converter circuit is operative to limit the output current flowing through the output stage, the output current being limited responsive to the output current exceeding a threshold; and
   wherein the output circuit enters the second mode operation when the current limit circuit is in the active state.

7. A configurable analog output circuit comprising:
   an output stage, the output stage having first and second modes of operation, the output stage providing an output device with an output current in the first mode of operation and providing the output device with an output voltage in the second mode of operation; and
   a detection circuit, the detection circuit being coupled to the output stage, and the detection circuit detecting a characteristic of the output device and, in response, placing the output stage in the first or second mode of operation,
   wherein the detection circuit is coupled to a configurable offset circuit, the configurable offset circuit applying a first offset to an input signal of the output circuit when the output circuit is in the first mode of operation and applying a second offset to the input signal when the output circuit is in the second mode of operation.

8. A configurable analog output circuit comprising:

an output stage, the output stage having first and second modes of operation, the output stage providing an output device with an output current in the first mode of operation and providing the output device with an output voltage in the second mode of operation; and a detection circuit, the detection circuit being coupled to the output stage, and the detection circuit detecting a characteristic of the output device and, in response, placing the output stage in the first or second mode of operation, wherein the output stage includes an impedance circuit;

wherein, in the second mode of operation, a current flows through the impedance circuit to produce the output voltage; and wherein the output circuit further comprises a compensation circuit, the compensation circuit providing compensation current to the output device in the first mode of operation to compensate for current diverted through the impedance circuit.

9. A configurable analog output circuit comprising:

an output stage, the output stage having first and second modes of operation, the output stage providing an output device with an output current in the first mode of operation and providing the output device with an output voltage in the second mode of operation; and a detection circuit, the detection circuit being coupled to the output stage, and the detection circuit detecting a characteristic of the output device and, in response, placing the output stage in the first or second mode of operation, wherein the detection circuit detects an impedance of the output device wherein the output circuit operates in the first mode of operation when the impedance of the output device is below a predetermined amount; and wherein the output circuit operates in the second mode of operation when the impedance of the output device is above the predetermined.

10. A system comprising:

(A) a controller;

(B) an output device; and (C) an analog output circuit including, (1) an input stage, the input stage being coupled to the controller and receiving an input signal from the controller,;

(2) a current output circuit, the current output circuit being capable of producing a current output signal usable to control a current through the output device responsive to the input signal;

(3) a voltage output circuit, the voltage output circuit being capable of producing a voltage output signal usable to control a voltage across the output device responsive to the input signal; and (4) a switch circuit, the switch circuit being capable of switching the analog output circuit between a first mode of operation in which the current output circuit is active and a second mode of operation in which the voltage output circuit is active, the switch circuit switching the analog output circuit between the first and second modes of operation responsive to a detected characteristic of the output device.

11. An output circuit according to claim 10, wherein the output device is a mechanical actuator.

12. An output circuit according to claim 10, wherein the detected characteristic of the output device is an impedance of the output device.

13. An output circuit according to claim 10, wherein, in the first mode of operation, the current output signal controls the current through the output device so as to vary in accordance with an equation having a form $I_{OUT}=m_1X+b_1$, where $I_{OUT}$ is a magnitude of the current through the output device, X is a magnitude of the input signal, $b_1$ is a magnitude of a first offset applied to the input signal, and $m_1$ is a first scale factor applied to the input signal; and wherein, in the second mode of operation, the voltage output signal controls the voltage across the output device so as to vary in accordance with an equation having a form $V_{OUT}=m_2X+b_2$, where $V_{OUT}$ is a magnitude of the voltage across the output device, X is a magnitude of the input signal, $b_2$ is a magnitude of a second offset applied to the input signal, and $m_2$ is a second scale factor applied to the input signal.

14. An output circuit according to claim 11, wherein the first offset $b_1$ and the second offset $b_2$ are applied by a configurable offset circuit, the configurable offset circuit receiving a control signal that varies depending on the detected characteristic of the output device.

15. A method of configuring an output circuit, comprising:

simultaneously attempting to provide an output current and an output voltage to an output device, the simultaneously attempting step being performed by an output circuit in accordance with an input signal received by the output circuit;

detecting (1) that providing the output device with the output current causes a voltage-providing capacity of the output circuit to be exceeded, or detecting (2) that providing the output device with the output voltage causes a current-providing capacity of the output-circuit to be exceeded, and in response to the detecting step (1), placing the output circuit in a voltage output mode of operation in which the output circuit varies the output voltage in accordance with the input signal and provides the output voltage to the output device, or in response to the detecting step (2), placing the output circuit in a current output mode of operation in which the output circuit varies the output current in accordance with the input signal and provides the output current to the output device.

* * * * *